United States Patent
Jeong et al.

(10) Patent No.: US 7,389,464 B2
(45) Date of Patent: Jun. 17, 2008

(54) APPARATUS AND METHOD FOR ENCODING AND DECODING A SPACE-TIME LOW DENSITY PARITY CHECK CODE WITH FULL DIVERSITY GAIN

(75) Inventors: Hong-Sil Jeong, Incheon (KR); Seok-Hyun Yoon, Seoul (KR); Jae-Yoel Kim, Gunpo-si (KR); Chan-Byoung Chae, Seoul (KR)

(73) Assignee: Samsung Electronics Co., Ltd (KR)

( * ) Notice: Subject to any disclaimer, the term of this patent is extended or adjusted under 35 U.S.C. 154(b) by 541 days.

(21) Appl. No.: 11/052,673

(22) Filed: Feb. 7, 2005

(65) Prior Publication Data
US 2005/0204273 A1    Sep. 15, 2005

(30) Foreign Application Priority Data
Feb. 6, 2004    (KR) .................. 10-2004-0007978

(51) Int. Cl.
*H03M 13/25*    (2006.01)
*H03M 13/29*    (2006.01)
*H04B 7/06*    (2006.01)
*H04B 7/07*    (2006.01)

(52) U.S. Cl. ............... 714/752; 375/299; 375/347; 714/755

(58) Field of Classification Search ........... 714/780, 714/752, 755; 375/299, 347
See application file for complete search history.

(56) References Cited

U.S. PATENT DOCUMENTS
7,013,116 B2 *    3/2006    Ashikhmin et al. ........ 455/214

OTHER PUBLICATIONS

Blanksby, A., et al., "A 690-mW 1-Gb/s 1024-b, Rate-1/2 Low-Density Parity-Check Code Decoder", IEEE Journal of Solid-State Circuits, vol. 37, No. 3, Mar. 2002, pp. 404-412.*

* cited by examiner

*Primary Examiner*—Stephen M. Baker
(74) *Attorney, Agent, or Firm*—The Farrell Law Firm, PC

(57) ABSTRACT

In a mobile communication system including a transmitter and a receiver, an LDPC code is generated by encoding received information data such that a fifth partial matrix obtained by combining a second partial matrix having even-numbered columns of a first partial matrix corresponding to the information data with a fourth partial matrix having odd-numbered columns of a third partial matrix corresponding to a parity, and an eighth partial matrix obtained by combining a sixth partial matrix having odd-numbered columns of the first partial matrix with a seventh partial matrix having even-numbered columns of the third partial matrix correspond to a ninth partial matrix obtained by exclusive-ORing the first partial matrix and the third partial matrix and a parity check matrix having a predetermined rank in a binary field. A space-time LDPC code is generated by spatial-mapping the LDPC code according to a predetermined spatial mapping scheme.

41 Claims, 7 Drawing Sheets

$$H = \begin{bmatrix} 1 & 0 & 1 & 0 & 1 & 0 & 1 & 0 \\ 1 & 0 & 0 & 1 & 0 & 1 & 0 & 1 \\ 0 & 1 & 1 & 0 & 0 & 1 & 1 & 0 \\ 0 & 1 & 0 & 1 & 1 & 0 & 0 & 1 \end{bmatrix}$$

APPARATUS AND METHOD FOR ENCODING AND DECODING A SPACE-TIME LOW DENSITY PARITY CHECK CODE WITH FULL DIVERSITY GAIN

PRIORITY

This application claims priority under 35 U.S.C. § 119 to an application entitled "Apparatus and Method for Encoding/Decoding Space-Time Low Density Parity Check Code with Full Diversity Gain" filed in the Korean Intellectual Property Office on Feb. 6, 2004 and assigned Serial No. 2004-7978, the contents of which are incorporated herein by reference.

BACKGROUND OF THE INVENTION

1. Field of the Invention

The present invention relates generally to a mobile communication system, and in particular, to an apparatus and method for encoding and decoding a space-time Low Density Parity Check (LDPC) code having a full diversity gain.

2. Description of the Related Art

In communications, it is most important to efficiently and reliably transmit data over a channel. In the next generation multimedia mobile communication into which active research is currently being made, it is necessary to increase system efficiency using a channel coding technique appropriate for the system, as there is an increased demand for a high-speed communication system capable of processing and transmitting a variety of information such as image and radio data beyond that of the early voice-oriented service.

Unlike a wired channel environment, a wireless channel environment existing in a wireless communication system inevitably from suffers errors caused by various conditions such as multipath interference, shadowing, propagation attenuation, interference, and fading. These errors commonly cause an information loss in the transmitted data. The information loss seriously distorts actual transmission signals, causing a reduction in entire performance of the mobile communication system.

Generally, in order to reduce the information loss, various error-control techniques are used according to characteristics of channels to increase reliability of the mobile communication system. The most typical error-control technique uses an error correction code.

Mobile communication systems use diversity schemes in order to remove communication instability caused by fading, and a space diversity scheme, one of the diversity schemes, uses multiple antennas.

Generally, the space diversity schemes are classified into a reception diversity scheme using multiple reception antennas, a transmission diversity scheme using multiple transmission antennas, and a Multiple-Input Multiple-Output (MIMO) scheme using multiple reception antennas and multiple transmission antennas. The MIMO scheme is a kind of Space-Time Coding (STC) scheme, and the STC scheme extends a time-domain coding scheme to a space-domain coding scheme by transmitting signals encoded with a predetermined coding scheme using multiple transmission antennas, thereby achieving a low error rate.

FIG. 1 is a block diagram schematically illustrating a transmitter in a conventional mobile communication system using an STC scheme. Referring to FIG. 1, the transmitter includes an encoder 110, a spatial mapper 120, a plurality of signal mappers of first to $M^{th}$ signal mappers 130-1-to 130-M, and a plurality of transmission antennas (Tx.ANT) of first to $M^{th}$ transmission antennas Tx.ANT#1 to Tx.ANT#M.

Upon receiving information data, the encoder 110 encodes the received information data into coded symbols at a predetermined coding rate with a predetermined coding scheme, and outputs the coded symbols to the spatial mapper 120. For example, if the information data is comprised of k bits and the coding rate is k/N, the encoder 110 encodes the k-bit information data into N coded symbols.

The spatial mapper 120 spatial-maps the coded symbols output from the encoder 110 with a predetermined spatial mapping scheme such that the coded symbols can be transmitted via the M transmission antennas, and outputs the spatial-mapped signals to their associated signal mappers. There are various possible spatial mapping schemes used by the spatial mapper 120, and it will be assumed in FIG. 1 that the spatial mapper 120 spatial-maps the coded symbols output from the encoder 110 in their output order. For example, if it is assumed that a coded symbol stream output from the encoder 110 is $C=[c_1,c_2, \ldots ,c_N]$, an output of the spatial mapper 120 becomes an $$M \times \frac{N}{M}$$

space-time codeword matrix defined as Equation (1).

$$C = \begin{bmatrix} c_1 & c_{M+1} & \cdots & c_{N-M+1} \\ c_2 & c_{M+2} & \cdots & c_{N-M+2} \\ \cdots & & & \\ c_M & c_{M+M} & \cdots & c_N \end{bmatrix} \quad (1)$$

Because the number of the transmission antennas is M, the spatial mapper 120 sequentially spatial-maps the coded symbols output from the encoder 110 in their output order, divides the spatial-mapped symbols into M signals, and outputs the M signals to the first to $M^{th}$ signal mappers 130-1 to 130-M associated thereto. The first to $M^{th}$ signal mappers 130-1 to 130-M each signal-map the signals output from the spatial mapper 120 with a predetermined signal mapping scheme, and transmit the signal-mapped signals over the air via their associated transmission antennas Tx.ANT#1 to Tx.ANT#M. Here, the first to $M^{th}$ signal mappers 130-1 to 130-M each signal-map input signals according to a constellation for the predetermined signal mapping scheme, and output the signal-mapped signals to the first to $M^{th}$ transmission antennas Tx.ANT#1 to Tx.ANT#M, respectively. Each of the first to $M^{th}$ signal mappers 130-1 to 130-M signal-maps an input signal with a Binary Phase Shift Keying (BPSK) scheme, which shifts a phase in association with a transmission sign using a carrier having constant amplitude and phase, if the number of bits constituting the input signal is n=1; signal-maps the input signal with a Quadrature Phase Shift Keying (QPSK) scheme, if the number of bits constituting the input signal is n=2; and signal-maps the input signal with an 8-ary Quadrature Amplitude Modulation (8QAM) scheme if the number of bits constituting the input signal is n=3.

In FIG. 1, because k-bit information data is transmitted via M transmission antennas, its coding rate is $$M \times \frac{k}{M}.$$

FIG. 2 is a block diagram schematically illustrating a receiver in a conventional mobile communication system using an STC scheme. Referring to FIG. 2, the receiver includes a plurality of reception antennas Rx.ANT of first to $P^{th}$ reception antennas Rx.ANT#1 to Rx.ANT#P, a detector 210, a spatial demapper 220, a space-time decoder 230, and a spatial mapper 240. Although it is assumed in FIG. 2 that the number P of reception antennas in the receiver is different from the number M of transmission antennas in the transmitter, the number of reception antennas in the receiver may be equal to the number of transmission antennas in the transmitter.

The signals transmitted by the transmitter via a plurality of transmission antennas (the first to $M^{th}$ transmission antennas Tx.ANT#1 to Tx.ANT#M) are received at the receiver through the first to $P^{th}$ reception antennas. The first to $P^{th}$ reception antennas output their received signals to the detector 210. The detector 210 detects transmission signals transmitted by the first to $M^{th}$ transmission antennas from the received signals output from the first to $P^{th}$ reception antennas, and outputs the detected transmission signals to the spatial demapper 220.

The spatial demapper 220 spatial-demaps the signals output from the detector 210 with a spatial demapping scheme corresponding to the spatial mapping scheme used in the transmitter, and outputs the spatial-demapped signal to the space-time decoder 230. The space-time decoder 230 decodes the signal output from the spatial-demapper 220 with a decoding scheme corresponding to the coding scheme used in the transmitter. When there is no error caused by the wireless channel environment, the signal output from the space-time decoder 230 is equal to the information data in the transmitter. Actually, however, because errors occur in the wireless channel environment, the space-time decoder 230 can perform iterative decoding for reliable decoding.

For the iterative decoding, the space-time decoder 230 outputs the signal decoded with a decoding scheme corresponding to the coding scheme used in the transmitter, to the spatial mapper 240. The spatial mapper 240 spatial-maps the signal output from the space-time decoder 230 with a spatial mapping scheme corresponding to the spatial mapping scheme used in the transmitter, and outputs the spatial-mapped signal to the detector 210 in order to perform iterative decoding. The application of the iterative decoding increases the decoding reliability of information data. Thereafter, the signal decoded in the space-time decoder 230 through the iterative decoding is output as the information data.

The term "space-time code" refers to a code encoded with the STC scheme, and the STC scheme, as described above, supplementally acquires additional information by extending a time-domain coding scheme to a space-domain coding scheme. That is, the STC scheme not only reduces an error rate by providing additional information in the time domain, but also increases a diversity gain in the space domain, thereby enabling correct signal decoding. Because the diversity gain corresponds to a slope of a signal-to-noise ratio (SNR) and an error rate of a space-time code, expressed with a log scale, when the space-time code is designed, maximization of the diversity gain (hereinafter, referred to as "full diversity gain") is the most important factor for determining performance of the space-time code.

In order to acquire the full diversity gain, the following Space-Time Code Design Conditions 1-3 should be satisfied in a process of designing the space-time code.

Space-Time Code Design Condition 1

In order to obtain the full diversity gain, a matrix B(c,e) should have a full rank for particular space-time codeword 'c' and space-time codeword 'e'. Here, the matrix B(c,e) is a matrix representing a difference between the space-time codeword 'c' and the space-time codeword 'e'.

Space-Time Code Design Condition 2 should be satisfied, especially when signals are mapped using the BPSK scheme.

Space-Time Code Design Condition 2

A space-time codeword has a full diversity gain, when all non-zero space-time codeword matrixes 'c' have a full rank in a binary field.

Space-Time Code Design Condition 3 should be satisfied, especially when signals are mapped using the QPSK scheme.

Space-Time Code Design Condition 3

A space-time codeword has a full diversity gain, when a space-time codeword matrix Φ(c) obtained by mapping all non-zero space-time codeword matrixes 'c' in a binary field has a full rank.

As described above, the space-time code is designed to have a full rank in order to acquire a full diversity gain. That is, the space-time code is designed such that its generation matrix (G) has a full rank.

The next generation communication system is developing into an advanced communication system providing high-speed, high-capacity data services having various qualities-of-service (QoS). In the high-speed, high-capacity data services, an information loss during transmission is fatal to the services. Therefore, error correction capability of the error correction code functions as an important factor of determining the entire QoS. Typically, the error correction code includes a turbo code and a low density parity check (LDPC) code.

It is well known that the LDPC code is superior in performance gain to a convolutional code that is conventionally used for error correction, during high-speed data transmission. More specifically, the LDPC code is advantageous in that it can efficiently correct an error caused by noises occurring in a wireless channel, thereby increasing the reliability of data transmission. In addition, the LDPC code can be decoded using an iterative decoding algorithm based on a sum-product algorithm on a factor graph. Because a decoder for the LDPC code uses the sum-product algorithm-based iterative decoding algorithm, it is lower in complexity to a decoder for the turbo code. In addition, the decoder for the LDPC code is easy to implement a parallel processing decoder, as compared with the decoder for the turbo code.

The turbo code has excellent performance approximating a channel capacity limit of Shannon's channel coding theorem, and the LDPC code known to have the highest performance shows performance having a difference of only about 0.04 [dB] at a channel capacity limit of Shannon's channel coding theorem at a bit error rate (BER) $10^{-5}$, using a block size $10^7$. Shannon's channel coding theorem shows that reliable communication is possible only at a data rate not exceeding a channel capacity.

Generally, although a random code having a very large block size shows performance approximating a channel capacity limit of Shannon's channel coding theorem, when a MAP (Maximum A Posteriori) or ML (Maximum Likelihood) decoding method is used, it is actually impossible to implement the decoding method because of its heavy calculation load.

The LDPC code is defined by a parity check matrix in which the majority of elements have a zero value and a minority of elements except the elements having the zero value has a non-zero value, for example, a value of 1. In the following description, it will be assumed that a non-zero value is a value of 1. Because the parity check matrix of the LDPC code has a small weight, it is possible to perform decoding through iterative decoding even in a block code having a relatively long length. If a block length of the block code is continuously increased, the block code exhibits performance approximating a capacity limit of a Shannon channel, like the turbo code. Herein, the term "weight" refers to the number of elements having a non-zero value among the elements constituting the parity check matrix. Therefore, the next generation communication system tends to actively use the LDPC code as the error correction code.

However, when the LDPC code performs encoding using the generation matrix like the space-time code, performance of the LDPC code cannot be guaranteed. That is, the LDPC code, as described above, is advantageous in that it has low decoding complexity because of the small weight of the parity check matrix, but when the parity check matrix is converted to a generation matrix, a weight of the generation matrix increases, causing an increase in decoding complexity.

As a result, when the space-time code is designed using the LDPC code, it is difficult to apply the foregoing design conditions proposed for the generation matrix of a general space-time code. Therefore, there is a demand for a scheme in which a space-time code using the LDPC code can acquire the full diversity gain, i.e., for a parity check matrix capable of acquiring the full diversity gain.

SUMMARY OF THE INVENTION

It is, therefore, an object of the present invention to provide an apparatus and method for encoding and decoding a space-time LDPC code acquiring a full diversity gain in a mobile communication system.

It is another object of the present invention to provide an apparatus and method for encoding and decoding a space-time LDPC code having a correlation between a plurality of transmission antennas in a mobile communication system using the plurality of transmission antennas.

It is further another object of the present invention to provide a method for designing a parity check matrix of a space-time LDPC code acquiring a full diversity gain in a mobile communication system.

In accordance with one aspect of the present invention, there is provided a method for generating a parity check matrix of a space-time low density parity check (LDPC) code in a mobile communication system including a transmitter using a plurality of transmission antennas and a receiver using a plurality of reception antennas. The method comprises the steps of determining a size of a parity check matrix such that the size of the parity check matrix corresponds to a coding rate used when information data is encoded into a space-time LDPC code; determining a length of a codeword of the space-time LDPC code; dividing the parity check matrix having the determined size into a first partial matrix corresponding to the information data and a second partial matrix corresponding to a parity corresponding to the information data; generating a third partial matrix having even-numbered columns of the first partial matrix; generating a fourth partial matrix having odd-numbered columns of the second partial matrix; generating a fifth partial matrix obtained by combining the third partial matrix with the fourth partial matrix; generating a sixth partial matrix having odd-numbered columns of the first partial matrix; generating a seventh partial matrix having even-numbered columns of the second partial matrix; generating an eighth partial matrix obtained by combining the sixth partial matrix with the seventh partial matrix; generating a ninth partial matrix obtained by exclusive-ORing the first partial matrix and the second partial matrix; and generating the parity check matrix such that the fifth partial matrix and the eighth partial matrix have a predetermined rank in the ninth partial matrix and a binary field.

In accordance with another aspect of the present invention, there is provided a method for generating a parity check matrix of a space-time low density parity check (LDPC) code in a mobile communication system including a transmitter using a plurality of transmission antennas and a receiver using a plurality of reception antennas. The method comprises the steps of determining a size of a parity check matrix such that the size of the parity check matrix corresponds to a coding rate used when information data is encoded into a space-time LDPC code; determining a length of a codeword of the space-time LDPC code; dividing the space-time LDPC code into a real-part space-time LDPC code and an imaginary-part space-time LDPC code; dividing the real-part space-time LDPC code into a first codeword transmitted via a first transmission antenna and a second codeword transmitted via a second transmission antenna; dividing the imaginary-part space-time LDPC code into a third codeword transmitted via the first transmission antenna and a fourth codeword transmitted via the second transmission antenna; dividing the parity check matrix into a first partial matrix corresponding to the first codeword and the third codeword and a second partial matrix corresponding to the second codeword and the fourth codeword; and generating the parity check matrix such that the first partial matrix, the second partial matrix, and a third partial matrix obtained by exclusive-ORing the first partial matrix and the second partial matrix have a predetermined rank in a binary field.

In accordance with further another aspect of the present invention, there is provided a method for encoding a space-time low density parity check (LDPC) code in a mobile communication system including a transmitter using a plurality of transmission antennas and a receiver using a plurality of reception antennas. The method comprises the steps of receiving information data; generating an LDPC code by encoding the information data such that a fifth partial matrix obtained by combining a second partial matrix having even-numbered columns of a first partial matrix corresponding to the information data with a fourth partial matrix having odd-numbered columns of a third partial matrix corresponding to a parity, and an eighth partial matrix obtained by combining a sixth partial matrix having odd-numbered columns of the first partial matrix with a seventh partial matrix having even-numbered columns of the third partial matrix correspond to a ninth partial matrix obtained by exclusive-ORing the first partial matrix and the third partial matrix and a parity check matrix having a predetermined rank in a binary field; and generating a space-time LDPC code by spatial-mapping the LDC code according to a predetermined spatial mapping scheme.

In accordance with further another aspect of the present invention, there is provided a method for encoding a space-time low density parity check (LDPC) code in a mobile communication system including a transmitter using a plurality of transmission antennas and a receiver using a plurality of reception antennas. The method comprises the steps of receiving information data; generating an LDPC code by encoding the information data such that a first partial matrix corresponding to a first codeword and a third codeword, a second partial matrix corresponding to a second codeword and a fourth codeword, and a third partial matrix obtained by exclusive-ORing the first partial matrix and the second partial matrix correspond to a parity check matrix having a predetermined rank in a binary field; and generating a space-time LDPC code by spatial-mapping the LDPC code according to a predetermined spatial mapping scheme; wherein the space-time LDPC code is divided into a real-part space-time LDPC code and an imaginary-part space-time LDPC code, the real-part space-time LDPC code is divided into a first codeword transmitted via a first transmission antenna among the plurality of transmission antennas and a second codeword transmitted via a second transmission antenna among the plurality of transmission antennas, and the imaginary-part space-time LDPC code is divided into a third codeword transmitted via the first transmission antenna and a fourth codeword transmitted via the second transmission antenna.

In accordance with further another aspect of the present invention, there is provided an apparatus for encoding a space-time low density parity check (LDPC) code in a mobile communication system including a transmitter using a plurality of transmission antennas and a receiver using a plurality of reception antennas. The apparatus comprises an LDPC encoding part for receiving information data, and encoding the information data into an LDPC code according to a control signal; a spatial mapper for generating a space-time LDPC code by spatial-mapping the LDPC code according to a predetermined spatial mapping scheme; and a controller for generating the LDPC code by encoding the information data such that a fifth partial matrix obtained by combining a second partial matrix having even-numbered columns of a first partial matrix corresponding to the information data with a fourth partial matrix having odd-numbered columns of a third partial matrix corresponding to a parity, and an eighth partial matrix obtained by combining a sixth partial matrix having odd-numbered columns of the first partial matrix with a seventh partial matrix having even-numbered columns of the third partial matrix correspond to a ninth partial matrix obtained by exclusive-ORing the first partial matrix and the third partial matrix and a parity check matrix having a predetermined rank in a binary field.

In accordance with further another aspect of the present invention, there is provided an apparatus for encoding a space-time low density parity check (LDPC) code in a mobile communication system including a transmitter using a plurality of transmission antennas and a receiver using a plurality of reception antennas. The apparatus comprises a space-time LDPC encoder for receiving information data, encoding the information data into an LDPC code according to a control signal, and generating a space-time LDPC code by spatial-mapping the LDPC code according to a predetermined spatial mapping scheme; and a controller for generating an LDPC code by encoding the information data such that a first partial matrix corresponding to a first codeword and a third codeword, a second partial matrix corresponding to a second codeword and a fourth codeword, and a third partial matrix obtained by exclusive-ORing the first partial matrix and the second partial matrix correspond to a parity check matrix having a predetermined rank in a binary field; wherein the space-time LDPC code is divided into a real-part space-time LDPC code and an imaginary-part space-time LDPC code, the real-part space-time LDPC code is divided into a first codeword transmitted via a first transmission antenna among the plurality of transmission antennas and a second codeword transmitted via a second transmission antenna among the plurality of transmission antennas, and the imaginary-part space-time LDPC code is divided into a third codeword transmitted via the first transmission antenna and a fourth codeword transmitted via the second transmission antenna.

In accordance with further another aspect of the present invention, there is provided a method for decoding a space-time low density parity check (LDPC) code in a mobile communication system including a transmitter using a plurality of transmission antennas and a receiver using a plurality of reception antennas. The method comprises the steps of: (a) detecting a reception signal from signals received via corresponding reception antennas; (b) performing spatial mapping node decoding based on a detected value of the received signals; (c) decoding the spatial-mapped-node-decoded signal according to a predetermined parity check matrix; (d) if probability values of the signals decoded according to the parity check matrix satisfy a predetermined iterative decoding stop condition, hard-deciding the probability values and outputs the hard-decided probability values as information data; and (e) if the probability values do not satisfy the iterative decoding stop condition, repeatedly performing the steps (b) and (c) until the probability values satisfies the iterative decoding stop condition.

In accordance with further another aspect of the present invention, there is provided an apparatus for decoding a space-time low density parity check (LDPC) code in a mobile communication system including a transmitter using a plurality of transmission antennas and a receiver using a plurality of reception antennas. The apparatus comprises a detector for detecting a reception signal from signals received via corresponding reception antennas; a spatial mapping node decoder for performing spatial mapping node decoding based on a detected value of the received signals; an LDPC decoding part for decoding the spatial-mapped-node-decoded signal according to a predetermined parity check matrix; and a controller for performing a control operation such that if probability values of the signals decoded according to the parity check matrix satisfy a predetermined iterative decoding stop condition, the probability values are hard-decided and output as information data, and if the probability values do not satisfy the iterative decoding stop condition, the spatial mapping node decoding process and the decoding process are repeatedly performed until the probability values satisfies the iterative decoding stop condition.

BRIEF DESCRIPTION OF THE DRAWINGS

The above and other objects, features, and advantages of the present invention will become more apparent from the following detailed description when taken in conjunction with the accompanying drawings in which.

DETAILED DESCRIPTION OF THE PREFERRED EMBODIMENT

Preferred embodiments of the present invention will now be described in detail herein below with reference to the annexed drawings. In the following description, a detailed description of known functions and configurations incorporated herein has been omitted for conciseness.

The present invention proposes a scheme for encoding/decoding a space-time code using a low density parity check (LDPC) code as an error correction code (hereinafter referred to as a "space-time LDPC code"). In particular, the present invention proposes a scheme for encoding and decoding the space-time LDPC code having a full diversity gain.

Before a description of the present invention is given, the LDPC code will be described in detail. The LDPC code can be decoded using an iterative decoding algorithm based on a sum-product algorithm on a factor graph. Because a decoder for the LDPC code uses the sum-product algorithm-based iterative decoding algorithm, it is lower in complexity to a decoder for the turbo code. In addition, the decoder for the LDPC code is easy to implement a parallel processing decoder, compared with the decoder for the turbo code. When the LDPC code is expressed with a factor graph, there are cycles on the factor graph of the LDPC code, and it is well known that iterative decoding on the factor graph of the LDPC code where cycles exist is suboptimal. Also, it has been experimentally proven that the LDPC code has excellent performance through iterative decoding.

The LDPC code, proposed by Gallager, is defined by a parity check matrix in which the majority of elements have a zero value and a minority of elements except the elements having the zero value has a non-zero value, for example, a value of 1. In the following description, it will be assumed that a non-zero value is a value of 1.

Because the parity check matrix of the LDPC code has a small weight, it is possible to perform decoding through iterative decoding even in a block code having a relatively long length. If a block length of the block code is continuously increased, the block code exhibits performance approximating a capacity limit of a Shannon channel, like a turbo code. Herein, the term "weight" refers to the number of elements having a non-zero value among the elements constituting the parity check matrix. For example, an (N, j, k) LDPC code is a linear block code having a block length N, and is defined by a sparse parity check matrix in which each column has j elements having a value of 1, each row has k elements having a value of 1, and all of the elements except for the elements having the value of 1 have a value of 0.

Figure 1:
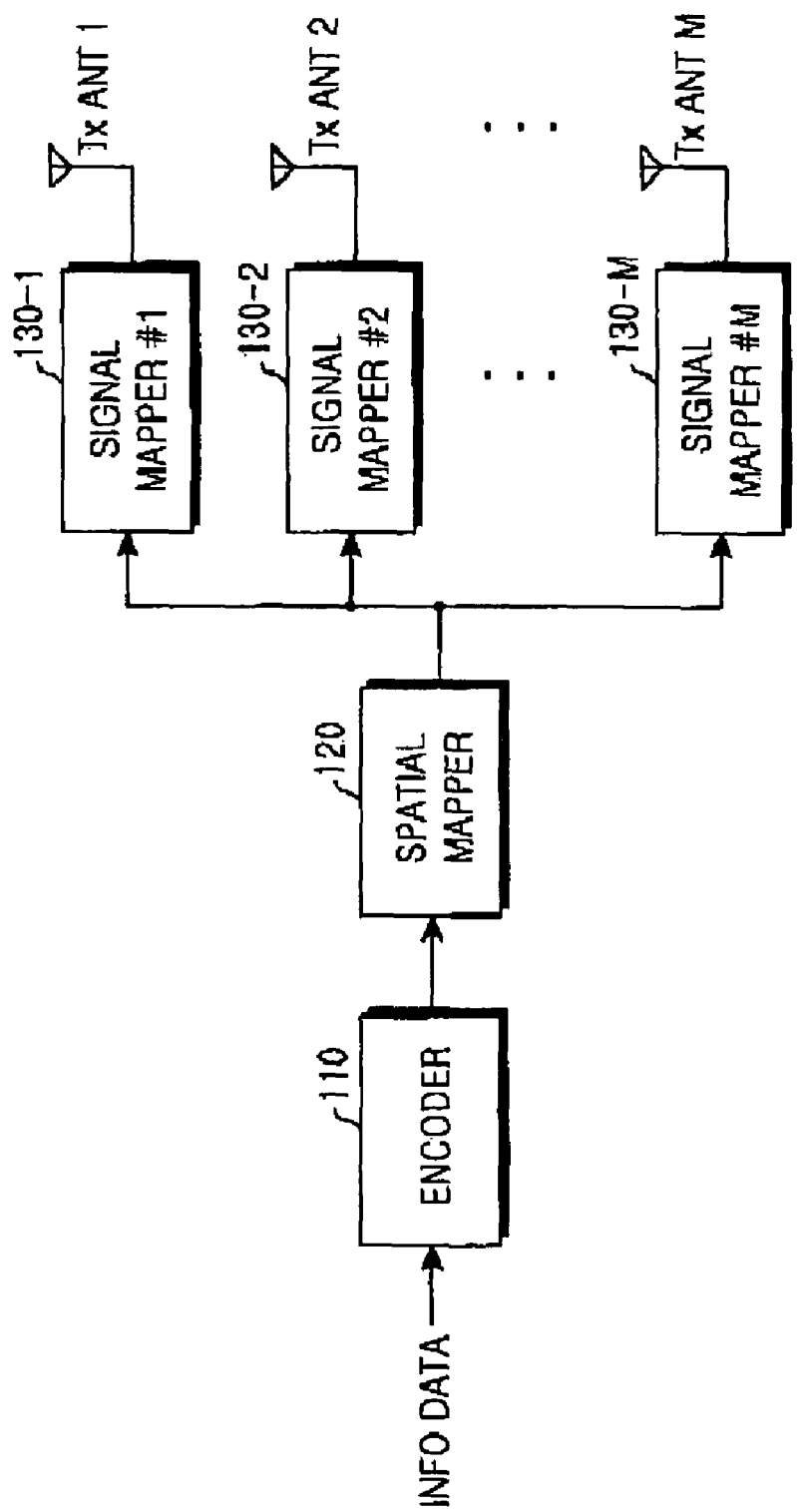
FIG. 1 is a block diagram schematically illustrating a transmitter in a conventional mobile communication system using an STC scheme.
Figure 2:
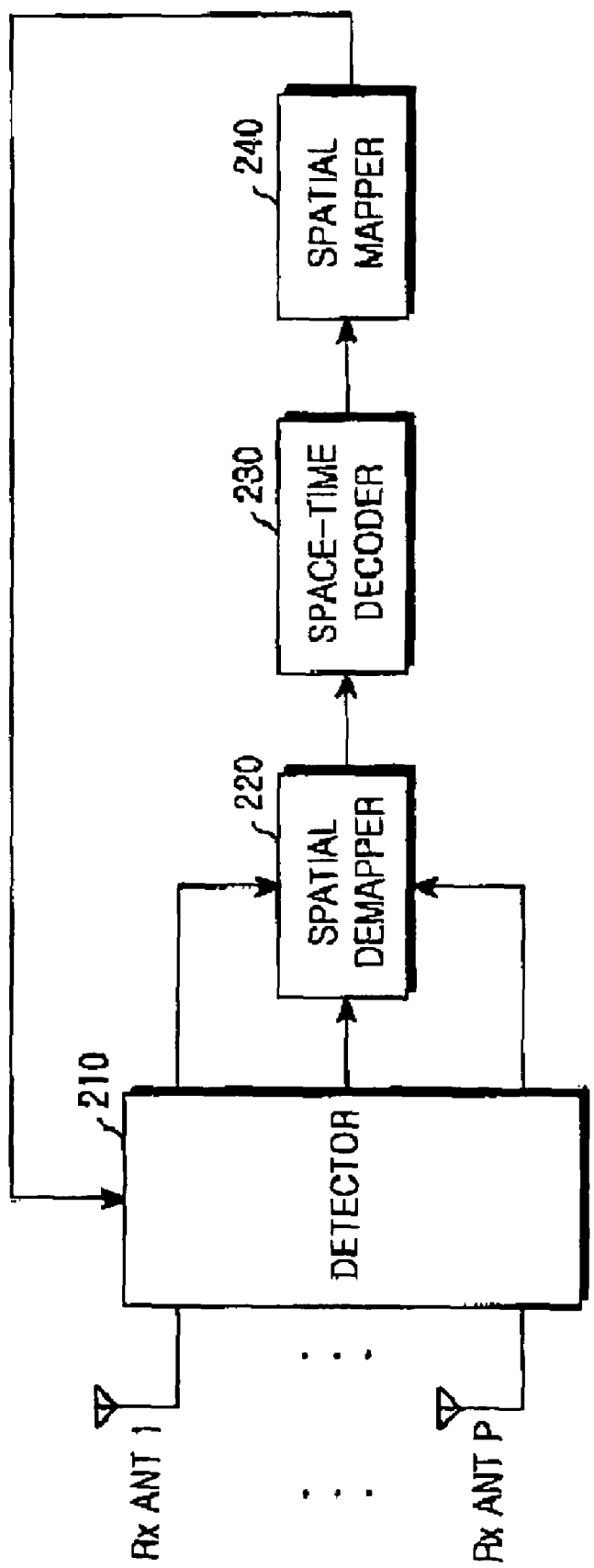
FIG. 2 is a block diagram schematically illustrating a receiver in a conventional mobile communication system using an STC scheme.
Figures 3, 4:
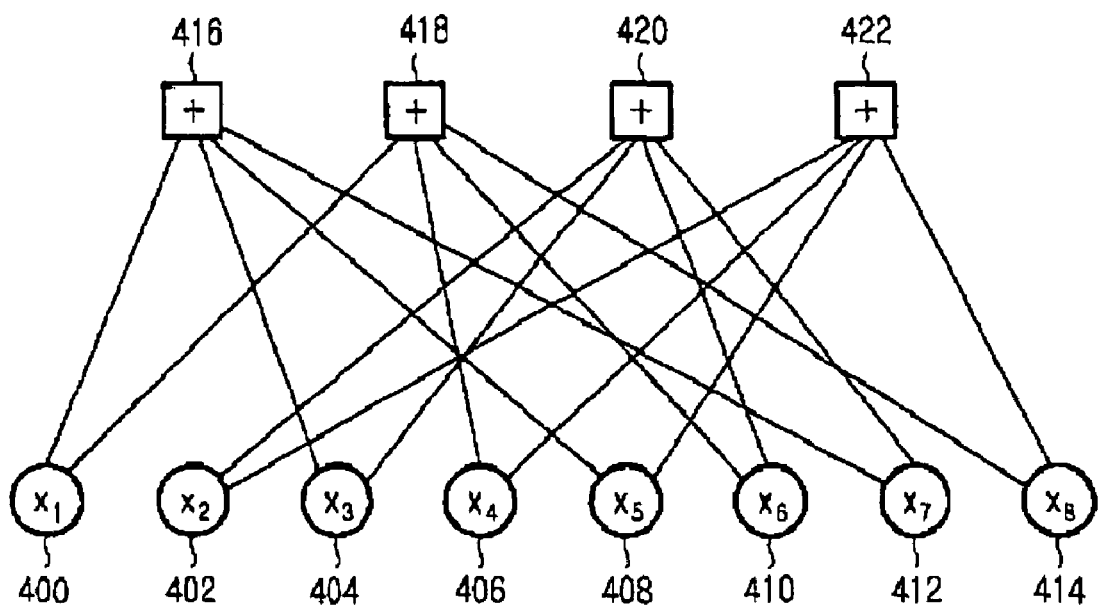
FIG. 3 is a diagram illustrating a parity check matrix of a conventional (8, 2, 4) LDPC code.
FIG. 4 is a diagram illustrating a factor graph of the (8, 2, 4) LDPC code illustrated in FIG. 3.

FIG. 3 is a diagram illustrating a parity check matrix of a conventional (8, 2, 4) LDPC code as an example of an (N, j, k) LDPC code. Referring to FIG. 3, a parity check matrix H of the (8, 2, 4) LDPC code includes 8 columns and 4 rows, wherein a weight of each column is fixed to 2 and a weight of each row is fixed to 4. Because the weight of each column and the weight of each row in the parity check matrix are regular as stated above, the (8, 2, 4) LDPC code becomes a regular LDPC code. However, if a weight of each column and a weight of each row in the parity check matrix are irregular, the LDPC code becomes an irregular LDPC code.

FIG. 4 is a diagram illustrating a factor graph of the (8, 2, 4) LDPC code of FIG. 3. Referring to FIG. 4, a factor graph of the (8, 2, 4) LDPC code includes 8 variable nodes of $x_1$ 400, $x_2$ 402, $x_3$ 404, $x_4$ 406, $x_5$ 408, $x_6$ 410, $x_7$ 412, and $x_8$ 414, and 4 check nodes 416, 418, 420, and 422. When an element having a value of 1, i.e., a non-zero value, exists at a point where an $i^{th}$ column and a $j^{th}$ row of the parity check matrix of the (8, 2, 4) LDPC code cross each other, a branch is created between a variable node $x_i$ and a $j^{th}$ check node.

Because the parity check matrix of the LDPC code has a very small weight, it is possible to perform decoding through iterative decoding even in a block code having a relatively long length, and if a block length of the block code is continuously increased, the block code exhibits performance approximating a capacity limit of a Shannon channel, like a turbo code. MacKay and Neal have proven that an iterative decoding process of an LDPC code using a flooding transfer technique is approximate to an iterative decoding process of a turbo code in terms of performance.

Accordingly, the present invention proposes a space-time LDPC encoding and decoding scheme capable of obtaining a full diversity gain when transmitting an LDPC code, thereby improving performance via a plurality of transmission antennas Tx.ANT.

Figure 5:
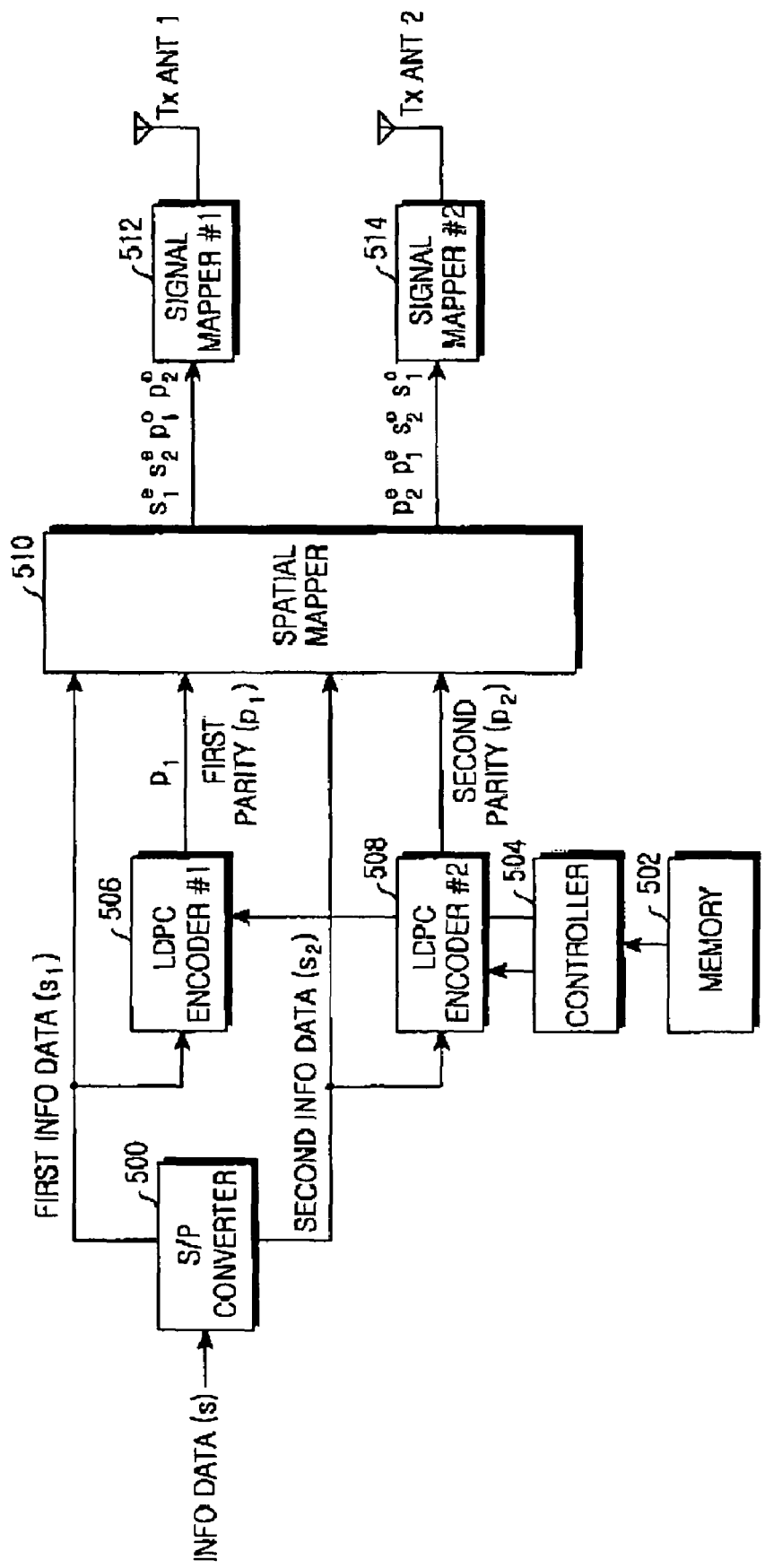
FIG. 5 is a block diagram schematically illustrating a transmitter according to an embodiment of the present invention, wherein a BPSK scheme is used as a signal mapping scheme.

FIG. 5 is a block diagram schematically illustrating a transmitter according to an embodiment of the present invention, wherein a Binary Phase Shift Keying (BPSK) scheme is used as a signal mapping scheme. Referring to FIG. 5, the transmitter includes a serial-to-parallel (S/P) converter 500, a memory 502, a controller 504, a first LDPC encoder (LDPC encoder #1) 506, a second LDPC encoder (LDPC encoder #2) 508, a spatial mapper 510, a plurality of, for example, 2 signal mappers of first signal mapper (signal mapper #1) 512 and second signal mapper (signal mapper #2) 514, and a plurality of transmission antennas Tx.ANT, for example, 2 of first and second transmission antennas Tx.ANT#1 and Tx.ANT#2. It will be assumed herein that the first and second signal mappers 512 and 514 each perform signal mapping using the BPSK scheme.

The memory 502 stores a parity check matrix based on a space-time LDPC code design method proposed in the present invention. The parity check matrix based on the space-time LDPC code design method proposed in the present invention will be described in detail later. When information data 's' is generated, the information data 's' is delivered to the S/P converter 500, and the S/P converter 500 parallel-converts the information data 's' into first information data $s_1$ and second information data $s_2$.

The first information data $s_1$ is input in common to the first LDPC encoder 506 and the spatial mapper 510, and the second information data $s_2$ is input in common to the second LDPC encoder 508 and the spatial mapper 510. The first LDPC encoder 506, under the control of the controller 504, encodes the first information data $s_1$ into an LDPC codeword, i.e., an LDPC coded symbol, according to a predetermined coding rate, and outputs the LDPC codeword to the spatial mapper 510. The controller 504 controls the first LDPC encoder 506 according to the parity check matrix stored in the memory 502 such that the first LDPC encoder 506 generates an LDPC codeword corresponding to the parity check matrix. For example, if it is assumed that the first information data $s_1$ is comprised of k bits and the coding rate is ½, the number of bits output from the first LDPC encoder 506 becomes N=2k. Here, the LDPC codeword output from the first LDPC encoder 506 becomes a first parity $p_1$, which is a part of a parity based on the entire information data 's'.

Similarly, the second LDPC encoder 508, under the control of the controller 504, encodes the second information data $s_2$ into an LDPC codeword, i.e., an LDPC coded symbol, according to a predetermined coding rate, and outputs the LDPC codeword to the spatial mapper 510. The controller 504 controls the second LDPC encoder 508 according to the parity check matrix stored in the memory 502 such that the second LDPC encoder 508 generates an LDPC codeword corresponding to the parity check matrix. For example, if it is assumed that the second information data $s_2$ includes k bits and the coding rate is ½, the number of bits output from the second LDPC encoder 508 becomes N=2k. The LDPC codeword output from the second LDPC encoder 508 becomes a second parity $p_2$, which is a part of a parity based on the entire information data 's'.

The parity check matrix stored in the memory 502 will be expressed as H, and the parity check matrix H is divided into an information part $H_s$ corresponding to the information data and a parity part $H_p$ corresponding to the parity, and can be expressed as shown in Equation (2).

$$H = [H_s H_p] \quad (2)$$

A size of the parity check matrix H is determined according to a coding rate of the transmitter and a size corresponding to a length of a space-time LDPC codeword, which is a final codeword. Herein, the 2-bit LDPC codeword output from the first LDPC encoder 506 will be referred to as a "first LDPC codeword $c_1$," and the 2-bit LDPC codeword output from the second LDPC encoder 508 will be referred to as a "second LDPC codeword $c_2$." The first LDPC codeword $c_1$ includes a k-bit information codeword $s_1$ and a k-bit parity codeword $p_1$, and the second LDPC codeword $c_2$ includes a k-bit information codeword $s_2$ and a k-bit parity codeword $p_2$. Therefore, the first LDPC codeword $c_1$ and the second LDPC codeword $c_2$ can be expressed as shown in Equation (3).

$$c_1 = [s_1 p_1]$$
$$c_2 = [s_2 p_2] \quad (3)$$

A relationship between the first LDPC codeword $c_1$ and the second LDPC codeword $c_2$ and the parity check matrix H is defined as shown in Equation (4).

$$H \cdot c_1 = [H_s H_p] \cdot [s_1 p_1]^T = 0$$
$$H \cdot c_2 = [H_s H_p] \cdot [s_2 p_2]^T = 0 \quad (4)$$

The spatial mapper 510 spatial-maps the first LDPC codeword $c_1$ output from the first LDPC encoder 506 and the second LDPC codeword $c_2$ output from the second LDPC encoder 508 into space-time LDPC codewords C with a predetermined spatial mapping scheme, and outputs the space-time codewords C to their associated signal mappers so that the space-time codewords C are transmitted via the first and second transmission antennas, respectively. There are various spatial mapping schemes in which the spatial mapper 510 spatial-maps the first LDPC codeword $c_1$ and the second LDPC codeword $c_2$. It will be assumed herein that the spatial mapper 510 performs spatial mapping based on a spatial mapping scheme described below.

The spatial mapper 510 performs spatial mapping such that an even-numbered information bit $s^e_1$ constituting an information codeword $s_1$ of the first LDPC codeword $c_1$ output from the first LDPC encoder 506, an even-numbered information bit $s^e_2$ constituting an information codeword $S_2$ of the second LDPC codeword $c_2$ output from the second LDPC encoder 508, an odd-numbered parity bit $p^o_1$ constituting a parity codeword $p_1$ of the first LDPC codeword $c_1$ output from the first LDPC encoder 506, and an odd-numbered parity bit $p^o_2$ constituting a parity codeword $p_2$ of the second LDPC codeword $c_2$ output from the second LDPC encoder 508 are transmitted via the first transmission antenna. Further, the spatial mapper 510 performs spatial mapping such that an even-numbered parity bit $p^e_2$ constituting a parity codeword $p_2$ of the second LDPC codeword $c_2$ output from the second LDPC encoder 508, an even-numbered parity bit $p^e_1$ constituting a parity codeword $p_1$ of the first LDPC codeword $c_1$ output from the first LDPC encoder 506, an odd-numbered information bit $s^o_2$ constituting an information codeword $S_2$ of the second LDPC codeword $c_2$ output from the second LDPC encoder 508, and an odd-numbered information bit $s^o_1$ constituting an information codeword $s_1$ of the first LDPC codeword $c_1$ output from the first LDPC encoder 506 are transmitted via the second transmission antenna.

When the first LDPC codeword $c_1$ and the second LDPC codeword $c_2$ are spatial-mapped in this manner, an output of the spatial mapper 510 becomes a space-time LDPC codeword C, which is a 2×k matrix, and can be expressed as shown in Equation (5).

$$C = \begin{bmatrix} s^e_1 & s^e_2 & p^o_1 & p^o_2 \\ p^e_2 & p^e_1 & s^o_2 & s^o_1 \end{bmatrix} \quad (5)$$

Because the first and second signal mappers 512 and 514 each signal-map input signals with the BPSK scheme, the space-time LDPC codeword C should satisfy a binary rank design rule. That is, as described above, if all non-zero space-time codeword matrixes have a full rank in a binary field, the space-time codeword has a full diversity gain. Therefore, in order to have a full diversity gain, the space-time LDPC codeword C should have a full rank in the binary field, and thus, the parity check matrix H should be designed to satisfy the following Parity Check Matrix Design Condition 1.

Parity Check Matrix Design Condition 1

$H_1 = [H_s^e H_p^o]$, $H_2 = [H_s^o H_p^e]$ and $H_s \oplus H_p$ should have a full rank in the binary field.

In Parity Check Matrix Design Condition 1, the matrix $H_1 = [H_s^e H_p^o]$ is a matrix obtained by combining a matrix $H_s^e$ having even-numbered columns in the matrix $H_s$ with a matrix $H_p^o$ having odd-numbered columns in the matrix $H_p$, and the matrix $H_2 = [H_s^o H_p^e]$ is a matrix obtained by combining a matrix $H_s^o$ having odd-numbered columns in the matrix $H_s$ with a matrix $H_p^e$ having even-numbered columns in the matrix $H_p$. When the parity check matrix H is designed to satisfy Parity Check Matrix Design Condition 1 in this manner, signals transmitted via different transmission antennas of the transmitter are linearly independent of each other.

Therefore, although a signal transmitted via any one of the transmission antennas experiences serious fading, a receiver can overcome an error caused by the fading.

The encoding process of the space-time LDPC code described in connection with FIG. 5 will be summarized herein below.

The parity check matrix H designed to satisfy Parity Check Matrix Design Condition 1 is stored in the memory 502, and the controller 504 performs a control operation such that the first LDPC encoder 506 and the second LDPC encoder 508 each encode their input information data according to the parity check matrix H stored in the memory 502. The spatial mapper 510, under the control of the controller 504, spatial-maps LDPC codewords 'c', i.e., the first LDPC codeword $c_1$ and the second LDPC codeword $c_2$, output from the first LDPC encoder 506 and the second LDPC encoder 508 in their output order, and outputs the first LDPC codeword $c_1$ and the second LDPC codeword $c_2$ to the first signal mapper 512 and the second signal mapper 514, respectively.

The first signal mapper 512 and the second signal mapper 514 each signal-map the signals output from the spatial mapper 510 with the BPSK scheme. The first signal mapper 512 transmits its signal-mapped signal over the air via the first transmission antenna, and the second signal mapper 514 transmits its signal-mapped signal over the air via the second transmission antenna.

Figure 6:
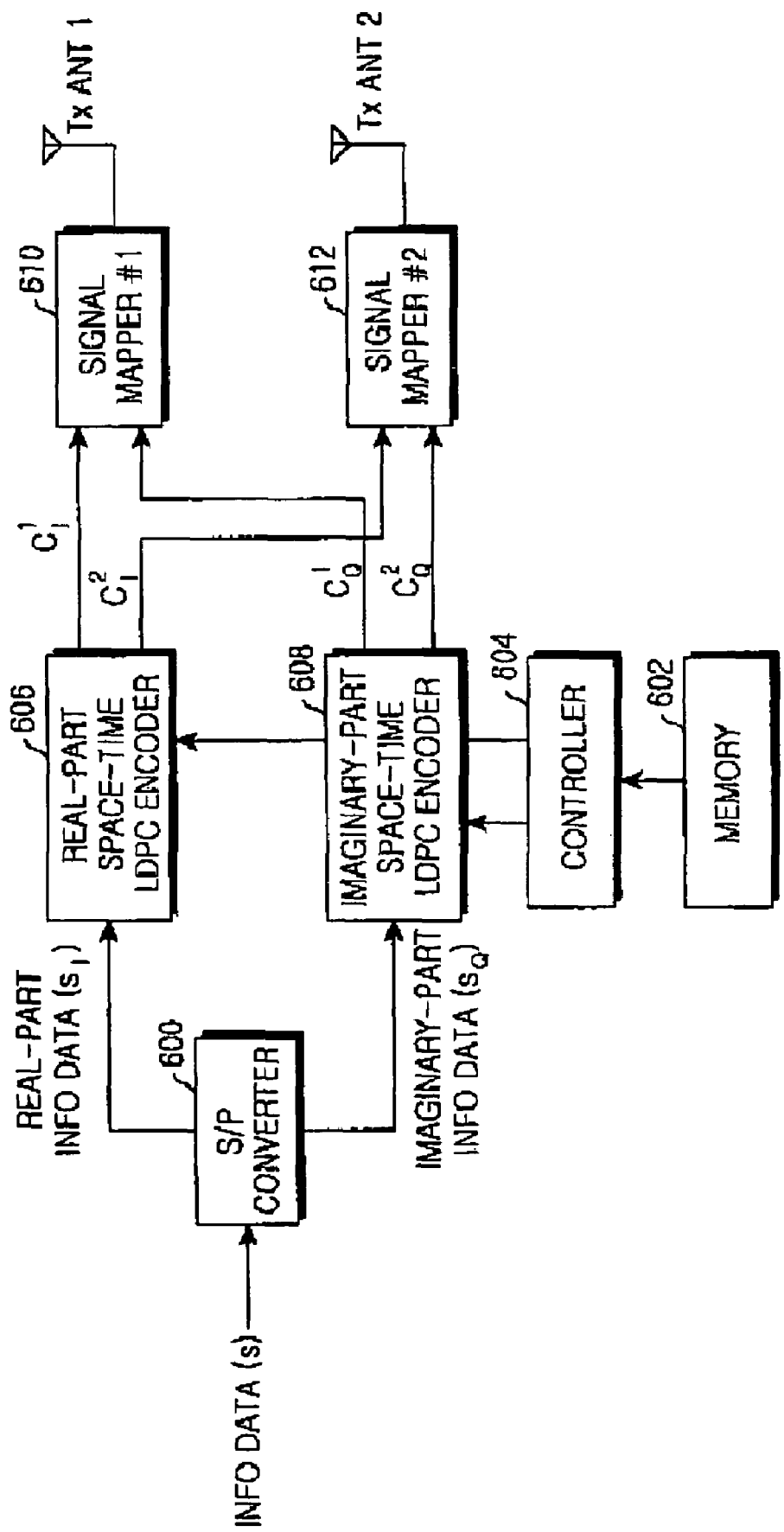
FIG. 6 is a block diagram schematically illustrating a transmitter according to an embodiment of the present invention, wherein a QPSK scheme and a 4QAM scheme are used as a signal mapping scheme.

FIG. 6 is a block diagram schematically illustrating a transmitter according to an embodiment of the present invention, wherein a Quadrature Phase Shift Keying (QPSK) scheme and a 4-ary Quadrature Amplitude Modulation (4QAM) scheme are used as the signal mapping scheme. Referring to FIG. 6, the transmitter includes a serial-to-parallel (S/P) converter 600, a memory 602, a controller 604, a real-part space-time LDPC encoder 606, an imaginary-part space-time LDPC encoder 608, a plurality of signal mappers, for example, 2, of first and second signal mappers 610 and 612, and a plurality of transmission antennas, for example, 2, of first and second transmission antennas Tx.ANT#1 and Tx.ANT#2. It will be assumed herein that the first and second signal mappers 610 and 612 each perform signal mapping using any one of the QPSK scheme and the 4QAM scheme.

The memory 602 stores a parity check matrix based on a space-time LDPC code design method proposed in the present invention. The parity check matrix based on the space-time LDPC code design method proposed in the present invention will be described in detail later.

Upon receiving information data 's', the S/P converter 600 parallel-converts the information data 's' into real-part information data $s_I$ and imaginary-part information data $S_Q$.

The real-part information data $s_I$ is input to the real-part space-time LDPC encoder 606, and the real-part space-time LDPC encoder 606, under the control of the controller 604, encodes the real-part information data $s_I$ into an LDPC codeword, i.e., an LDPC coded symbol, according to a predetermined coding rate, generates a space-time LDPC codeword by performing real-part space-time LDPC coding, and outputs the space-time LDPC codeword to the first signal mapper 610 and the second signal mapper 612. The controller 604 controls the real-part space-time LDPC encoder 606 according to the parity check matrix stored in the memory 602 so that the real-part space-time LDPC encoder 606 generates a space-time LDPC codeword corresponding to the parity check matrix. For example, if it is assumed that the real-part information data $s_I$ includes k bits and the coding rate is ½, the number of bits output from the real-part space-time LDPC encoder 606 becomes N=2k. As a result, output data of the real-part space-time LDPC encoder 606 becomes a 2k-bit space-time LDPC codeword. The space-time LDPC codeword output from the real-part space-time LDPC encoder 606 is denoted by $C_1$, and the space-time LDPC codeword $C_1$ is divided into $C_I^1$ transmitted via the first transmission antenna and $C_I^2$ transmitted via the second transmission antenna.

Also, the imaginary-part information data $s_Q$ is input to the imaginary-part space-time LDPC encoder 608, and the imaginary-part space-time LDPC encoder 608, under the control of the controller 604, encodes the imaginary-part information data $s_Q$ into an LDPC codeword, i.e., an LDPC coded symbol, according to a predetermined coding rate, generates a space-time LDPC codeword by performing imaginary-part space-time LDPC coding, and outputs the space-time LDPC codeword to the first signal mapper 610 and the second signal mapper 612. The controller 604 controls the imaginary-part space-time LDPC encoder 608 according to the parity check matrix stored in the memory 602 so that the imaginary-part space-time LDPC encoder 608 generates a space-time LDPC codeword corresponding to the parity check matrix. For example, if it is assumed that the imaginary-part information data $s_Q$ includes k bits and the coding rate is ½, the number of bits output from the imaginary-part space-time LDPC encoder 608 becomes N=2k. As a result, output data of the imaginary-part space-time LDPC encoder 608 becomes a 2k-bit space-time LDPC codeword. The space-time LDPC codeword output from the imaginary-part space-time LDPC encoder 608 is denoted by $C_Q$, and the space-time LDPC codeword $C_Q$ is divided into $C_Q^1$ transmitted via the first transmission antenna and $C_Q^2$ transmitted via the second transmission antenna.

If the parity check matrix stored in the memory 602 is denoted by H, the parity check matrix H is divided into a first part $H_1$ corresponding to a codeword transmitted via the first transmission antenna and a second part $H_2$ corresponding to a codeword transmitted via the second transmission antenna. The first part $H_1$ and the second part $H_2$ constitute a space-time LDPC codeword, and can be expressed as shown in Equation (6).

$$H=[H_1 H_2] \quad (6)$$

A size of the parity check matrix H is determined according to a coding rate of the transmitter and a size corresponding to a length of a space-time LDPC codeword, which is a final codeword. The space-time LDPC codeword $C_1$ generated from the real-part space-time LDPC encoder 606 and the space-time LDPC codeword $C_Q$ generated from the imaginary-part space-time LDPC encoder 608 can be expressed as shown in Equation (7).

$$C_1 = \begin{bmatrix} c_I^1 \\ c_I^2 \end{bmatrix}, \quad C_Q = \begin{bmatrix} c_Q^1 \\ c_Q^2 \end{bmatrix} \quad (7)$$

Here, a relationship between the space-time LDPC codeword $C_1$ and the space-time LDPC codeword $C_Q$ and the parity check matrix H is defined as shown in Equation (8).

$$H \cdot C_1 = [H_1 H_2] \cdot [c_I^1 c_I^2]^T = 0$$

$$H \cdot C_Q = [H_1 H_2] \cdot [c_Q^1 c_Q^2]^T = 0 \quad (8)$$

The first signal mapper 610 signal-maps the $C_I^1$ output from the real-part space-time LDPC encoder 606 and the $C^{Q1}$ output from the imaginary-part space-time LDPC encoder 608 in accordance with Equation (9), and transmits the signal mapping result via the first transmission antenna.

$$\left(\frac{-1}{\sqrt{(2)}}\right)^{c_I^1} + j\left(\frac{-1}{\sqrt{(2)}}\right)^{c_Q^1} \quad (9)$$

The second signal mapper 612 signal-maps the $C^2$ output from the real-part space-time LDPC encoder 606 and the $C^{Q^2}$ output from the imaginary-part space-time LDPC encoder 608 in accordance with Equation (10), and transmits the signal mapping result via the first transmission antenna.

$$\left(\frac{-1}{\sqrt{(2)}}\right)^{c_I^2} + j\left(\frac{-1}{\sqrt{(2)}}\right)^{c_Q^2} \quad (10)$$

In this case, a space-time LDPC codeword C, which is a 2×k matrix, can be expressed as shown in Equation (11).

$$C = \begin{bmatrix} c_I^1 + jc_Q^1 \\ c_I^2 + jc_Q^2 \end{bmatrix} \quad (11)$$

However, because the first signal mapper 610 and the second signal mapper 612 each perform signal mapping with any one of the QPSK scheme and the 4QAM scheme, the space-time LDPC codeword C should satisfy a QPSK binary rank design rule. That is, as described above, when all non-zero space-time codewords are mapped in a binary field, if the mapped space-time codeword has a full rank in the binary field, the space-time codeword has a full diversity gain. Therefore, in order to have a full diversity gain, the space-time LDPC codeword C should have a full rank in the binary field, and thus, the parity check matrix H should be designed so as to satisfy the following Parity Check Matrix Design Condition 2.

Parity Check Matrix Design Condition 2

The real-part space-time LDPC codeword $C_1$ and the imaginary-part space-time LDPC codeword $C_Q$ obtain a full diversity gain in the binary field, and $H_1$, $H_2$, and $H_1 \oplus H_2$ should have a full rank in the binary field.

In Parity Check Matrix Design Condition 2, the matrix $H_1$ denotes a parity matrix corresponding to a codeword transmitted via the first transmission antenna in the matrix H, and the matrix $H_2$ denotes a parity matrix corresponding to a codeword transmitted via the second transmission antenna in the matrix H.

The encoding process of the space-time LDPC code described in connection with FIG. 6 will be summarized herein below.

The parity check matrix H designed to satisfy Parity Check Matrix Design Condition 2 is stored in the memory 602, and the controller 604 performs a control operation such that the real-part space-time LDPC encoder 606 and the imaginary-part space-time LDPC encoder 608 each encode their input information data according to the parity check matrix H stored in the memory 602. The space-time LDPC codeword $C_1$ and the space-time LDPC codeword $C_Q$ output from the real-part space-time LDPC encoder 606 and the imaginary-part space-time LDPC encoder 608 are input to the first signal mapper 610 and the second signal mapper 612, under the control of the controller 604.

The first signal mapper 610 and the second signal mapper 612 each signal-map the space-time LDPC codeword $C_1$ and the space-time LDPC codeword $C_Q$ output from the real-part space-time LDPC encoder 606 and the imaginary-part space-time LDPC encoder 608 with any one of the QPSK and 4QAM schemes. The first signal mapper 610 transmits its signal-mapped signal over the air via the first transmission antenna, and the second signal mapper 612 transmits its signal-mapped signal over the air via the second transmission antenna.

Figure 7:
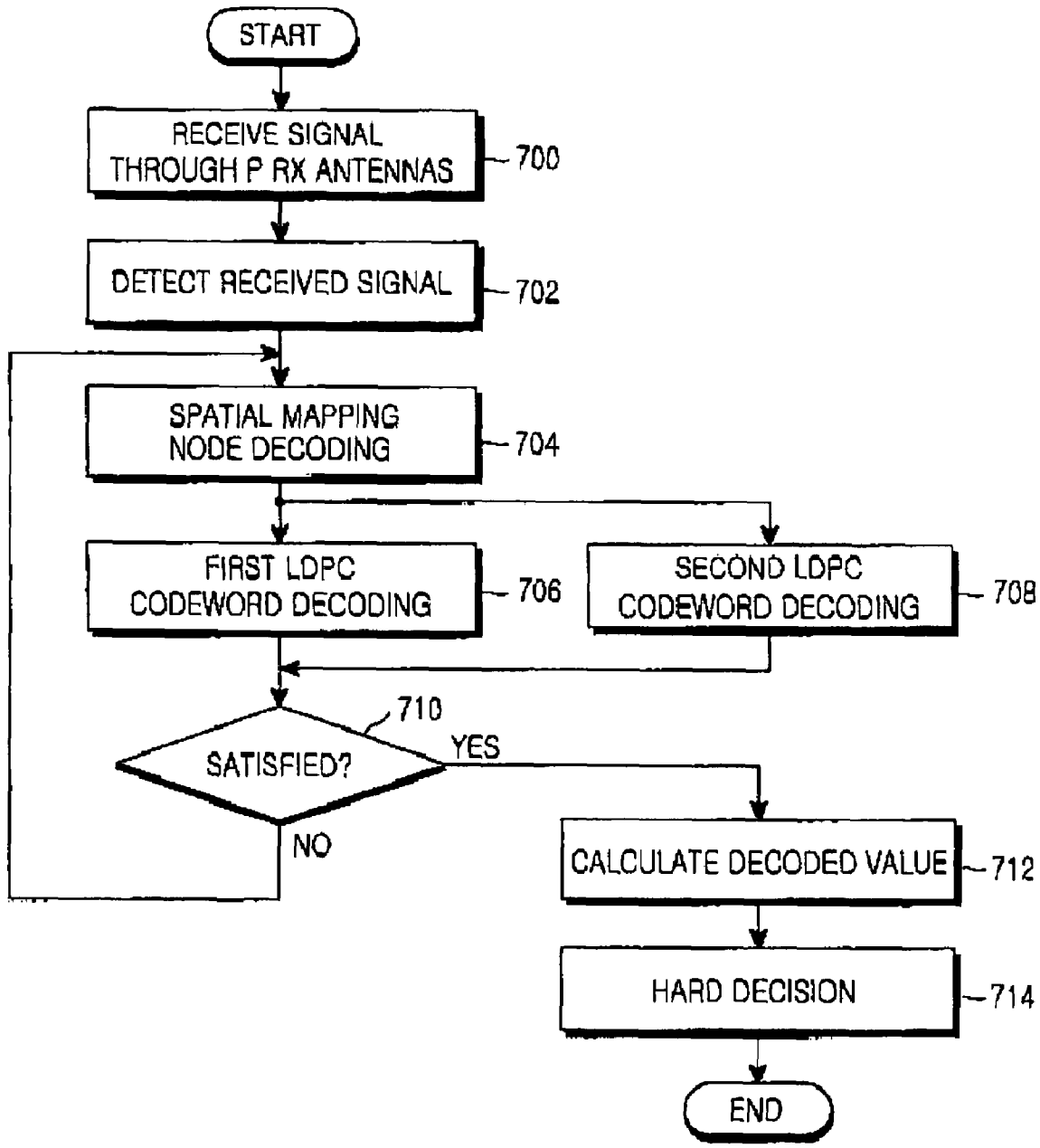
FIG. 7 is a flowchart illustrating an operation of a receiver in a mobile communication according to an embodiment of the present invention.

FIG. 7 is a flowchart illustrating an operation of a receiver in a mobile communication system according to an embodiment of the present invention. Referring to FIG. 7, in step 700, the receiver receives signals transmitted by its corresponding transmitter via a plurality of reception antennas, for example, P, of first to $P^{th}$ reception antennas prepared therein. In step 702, the receiver detects received signals based on the signals received via the first to $P^{th}$ reception antennas. There are various possible schemes for detecting the received signals, and it is assumed in FIG. 7 that the received signals are detected with the following scheme.

In step 704, the receiver performs spatial mapping node decoding on the detected received signals. Here, the spatial mapping node decoding refers to an operation detecting a message transmitted from a spatial mapping node to a first LDPC decoder (not shown) and a second LDPC decoder (not shown) based on a message transmitted from a reception node to the spatial mapping node, a decoded output value for a first LDPC codeword, i.e., a decoded output value of the first LDPC decoder for decoding the first LDPC codeword, and a decoded output value for a second LDPC codeword, i.e., a decoded output value of the second LDPC decoder for decoding the second LDPC codeword. In step 706, the receiver performs a decoding process on the first LDPC codeword, i.e., performs a first LDPC decoding process. In step 708, the receiver performs a decoding process on the second LDPC codeword, i.e., performs a second LDPC decoding process. After steps 706 and 708, the receiver proceeds to step 710.

In step 710, the receiver determines if a decoding stop condition is satisfied based on the results of the first LDPC decoding process and the second LDP decoding process. The decoding stop condition is given to determine if a predetermined iteration number has arrived or a decoding result up to now satisfies the parity check matrix H. That is, the receiver stops the decoding operation when the number of decoding processes exceeds the iteration number or the decoding result up to now satisfies the parity check matrix H.

If it is determined in step 710 that the decoding stop condition is satisfied, in step 712, the receiver calculates a decoded value based on the decoding result up to now, i.e., the result value of the first LDPC decoding process and the result value of the second LDPC decoding process. In step 714, the receiver performs hard decision on information data based on the calculated decoded value, and then ends all of the decoding processes.

However, if it is determined in step 710 that the decoding stop condition is not satisfied, the receiver returns to step 704. That is, the receiver performs iterative decoding on the initially received signal, thereby improving its decoding performance.

Figure 8:
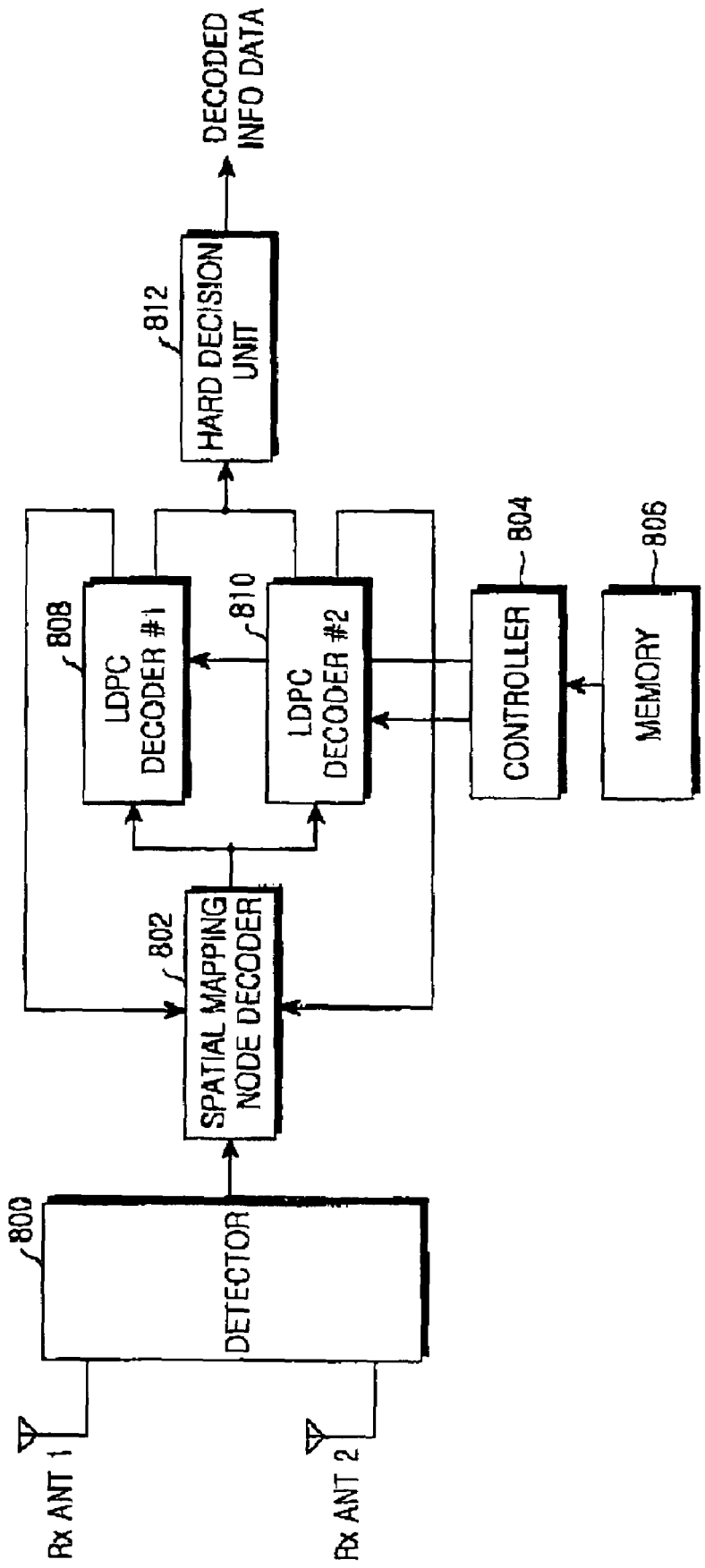
FIG. 8 is a block diagram schematically illustrating a receiver in a mobile communication system according to an embodiment of the present invention.

FIG. 8 is a block diagram schematically illustrating a receiver in a mobile communication system according to an embodiment of the present invention. Referring to FIG. 8, the receiver includes a plurality of reception antennas, for example, 2, of first and second reception antennas, a detector 800, a spatial mapping node decoder 802, a controller 804, a memory 806, a first LDPC decoder (LDPC decoder #1) 808, a second LDPC decoder (LDPC decoder #2) 810, and a hard decision unit 812.

The first and second reception antennas each receive signals transmitted by a corresponding transmitter, and output the received signals to the detector 800. The detector 800 detects transmission signals transmitted from first and second transmission antennas of the transmitter, from the received signals output from the first and second reception antennas, and outputs the detected signals to the spatial mapping node decoder 802. The spatial mapping node decoder 802 receives the signal output from the detector 800, spatial-demaps an estimation value detected by the detector 800 for the signals transmitted from the first transmission antenna and the second transmission antenna, and outputs the spatial demapping result to the first LDPC decoder 808 and the second LDPC decoder 810. Although the signal input to the spatial mapping node decoder 802 includes only the signal output from the detector 800 at first, it later includes not only the signal output from the detector 800, but also the signals output from the first LDPC decoder 808 and the second LDPC decoder 810.

The first LDPC decoder 808 performs LDPC decoding on the signal output from the spatial mapping node decoder 802 with a decoding scheme corresponding to an encoding scheme used in a first LDPC encoder based on a parity check matrix designed in a space-time LDPC encoder of the transmitter. When the transmitter uses the QPSK scheme as a signal mapping scheme as described in connection with FIG. 6, the first LDPC decoder 808 performs a decoding operation corresponding to an encoding operation of the real-part space-time LDPC encoder 606. That is, the controller 804 controls the first LDPC decoder 808 to perform a decoding process according to a parity check matrix designed to obtain a full diversity gain, stored in the memory 806.

Similarly, the second LDPC decoder 810 performs LDPC decoding on the signal output from the spatial mapping node decoder 802 with a decoding scheme corresponding to an encoding scheme used in a second LDPC encoder based on the parity check matrix designed in the space-time LDPC encoder of the transmitter. When the transmitter uses the QPSK scheme as a signal mapping scheme as described in connection with FIG. 6, the second LDPC decoder 810 performs a decoding operation corresponding to an encoding operation of the imaginary-part space-time LDPC encoder 608. That is, the controller 804 controls the second LDPC decoder 810 to perform a decoding process according to the parity check matrix designed to obtain a full diversity gain, stored in the memory 806.

A detailed description will now be made of operations of the detector 800 and the spatial mapping node decoder 802.

A transmission signal transmitted at a particular time t will be defined as a 2-element transmission signal vector $x_t$, and a reception signal received at the particular time t will be defined as a 1-element reception signal vector $y_t$. Because the transmission signal vector $x_t$ is transmitted via two transmission antennas of first and second transmission antennas, it includes two elements.

A channel that the transmission signal experiences is a fading channel, the fading channel will be expressed as a 1×2 matrix $\Omega_t$, and a noise component will be expressed as a 1-element noise vector $n_t$. Then, a relation of Equation (12) is given.

$$y_t = \Omega_t x_t + n_t \tag{12}$$

In Equation (12), the transmission signal vector $x_t$ can be expressed as $x_t=(x_t^1, x_t^2)$ considering the signals transmitted via the first and second transmission antennas at a time t. Here, $x_t^1$ denotes a signal transmitted via the first transmission antenna at the time t, and $x_t^2$ denotes a signal transmitted via the second transmission antenna at the time t. Therefore, for the transmission signal vector $x_t=(x_t^1, x_t^2)$, a probability vector $P_t$ for the reception signal vector $y_t$ can be expressed as shown in Equation (13). For convenience, it will be assumed herein that the signal mapping scheme used by the transmitter is the BPSK scheme, and the QPSK scheme rather than the BPSK scheme can also be used as the signal mapping scheme.

$$P_t=(P_t(x_t^1=1, x_t^2=1), P_t(x_t^1=-1, x_t^2=-1), P_t(x_t^1=-1)) \tag{13}$$

As shown in Equation (13), for the transmission signal vector $x_t=(x_t^1, x_t^2)$, the probability vector $P_t$ for the reception signal vector $y_t$ includes 4 elements. Because the transmitter uses the BPSK scheme as its signal mapping scheme, the probability vector $P_t$ includes 4 elements. As a result, the reception signal vector $y_t$ becomes a message detected for the detector 800.

When $x_t=(x_t^1, x_t^2)=(i,j),(i,j\in-1,1)$, each of the 4 elements of the probability vector Pt can be calculated by Equation (14).

$$P_t(x_t^1=i, x_t^2=j)=Pr(x_t^1=i, x_t^2=j|y_t) \tag{14}$$

In Equation (14), Pr denotes an operator for calculating probability. As described above, the detector 800 detects the probability vector $P_t$, and outputs the detected probability vector $P_t$ to the spatial mapping node decoder 802.

A log likelihood ratio (LLR) message output from the spatial mapping node decoder 802 to the first LDPC decoder 808, transmitted from the first transmission antenna, can be expressed as shown Equation (15).

$$\begin{aligned} L_t^1 &= \log\frac{Pr(x_t^1=+1|y_t)}{Pr(x_j^1=-1|y_t)} \\ &= \log\frac{\sum_{x_t^2\in\{-1,1\}} Pr(x_t^1=+1, x_t^2|y_t)Pr(x_t^2|y_t)}{\sum_{x_t^2\in\{-1,1\}} Pr(x_j^1=-1, x_t^2|y_t)Pr(x_t^2|y_t)} \end{aligned} \tag{15}$$

In Equation (15), $Pr(x_k^2|y_k)$ can be detected from the output values of the first LDPC decoder 808 and the second LDPC decoder 810. Also, an LLR message transmitted from the second transmission antenna can be detected in the same method as the method for detecting the LLR message transmitted from the first transmission antenna. The LLR message transmitted from the second transmission antenna is input to the second LDPC decoder 810.

Above, a description has been made of operations of the detector 800 and the spatial mapping node decoder 802 when the transmitter uses the BPSK scheme as its signal mapping scheme. Next, a description will be made of operations of the detector 800 and the spatial mapping node decoder 802 when the transmitter uses the QPSK scheme as its signal mapping scheme.

For a transmission signal vector $x_t=((x_t^1)^I,(x_t^1)^Q,(x_t^2)^I,(x_t^2)^Q)$ transmitted by the transmitter, a probability vector $P_t$ for a reception signal vector $y_t$ received at the receiver can be expressed as shown in Equation (16).

$$\begin{aligned} P_t=(P_t((x_t^1)^I=1,(x_t^1)^Q=1,(x_t^2)^I=1,(x_t^2)^Q=1,\ldots, \\ P_t(x_t^1)^I=-1,(x_t^1)^Q=-1,(x_t^2)^I=-1,(x_t^2)^Q=-1)) \end{aligned} \tag{16}$$

As shown in Equation (16), for the transmission signal vector $x_t=((x_t^1)^I,(x_t^1)^Q,(x_t^2)^I,(x_t^2)^Q)$, the probability vector $P_t$ for the reception signal vector $y_t$ includes 16 elements. Because the transmitter uses the QPSK scheme as its signal mapping scheme, the probability vector $P_t$ includes 16 elements. As a result, the reception signal vector $y_t$ becomes a message detected for the detector 800.

When $x_t=((x_t^1)^I,(x_t^1)^Q,(x_t^2)^I,(x_t^2)^Q)=(i,j,k,l),(i,j,k,l \in -1,1)$ 16 elements of the probability vector $P_t$ can be calculated by Equation (17).

$$P_t((x_t^1)^I=i,(x_t^1)^Q=j,(x_t^2)^I=j,(x_t^2)^Q=1)=Pr((x_t^1)^I=i,(x_t^1)^Q=j,(x_t^2)^I=k,(x_t^2)^Q=1|y_t) \quad (17)$$

As described above, the detector 800 detects the probability vector $P_t$, and outputs the detected probability vector $P_t$ to the spatial mapping node decoder 802. A real-part LLR message output from the spatial mapping node decoder 802 to the first LDPC decoder 808, transmitted from the first transmission antenna, can be expressed as shown in Equation (18).

$$(L_t^1)^I = \log \frac{Pr((x_t^1)^I = +1 \mid y_t)}{Pr((x_t^1)^I = -1 \mid y_t)} \quad (18)$$

$$= \log \frac{\sum_{(x_t^1)^Q,(x_t^2)^I,(x_t^2)^Q \in \{-1,1\}} Pr((x_t^1)^I = +1, (x_t^1)^Q(x_t^2)^I, (x_t^2)^Q \mid y_t)}{\sum_{(x_t^1)^Q,(x_t^2)^I,(x_t^2)^Q \in \{-1,1\}} Pr((x_t^1)^I = -1, (x_t^1)^Q(x_t^2)^I, (x_t^2)^Q \mid y_t)}$$

$$Pr((x_t^1)^Q(x_t^2)^I, (x_t^2)^Q \mid y_t)$$

In Equation (18), $Pr((x_t^1)^Q, (x_t^2)^I, (x_t^2)^Q|y_k)$ can be detected from the output values of the first LDPC decoder 808 and the second LDPC decoder 810. Also, an imaginary-part LLR message transmitted from the first transmission antenna, a real-part LLR message transmitted from the second transmission antenna and an imaginary-part LLR message transmitted from the second transmission antenna can be detected in the same method as the method for detecting the real-part LLR message transmitted from the first transmission antenna. The LLR message transmitted from the second transmission antenna is input to the second LDPC decoder 810.

The first LDPC decoder 808 and the second LDPC decoder 810 decode a first LDPC codeword and a second LDPC codeword based on the output value of the spatial mapping node decoder 802, and the decoded signals are input back to the partial mapping node decoder 802 and the hard decision unit 812, thereby increasing reliability of initially estimated signals. The hard decision unit 812 performs a hard decision on the signals output from the first LDPC decoder 808 and the second LDPC decoder 810, finally restoring the signals into information data.

As described above, the present invention newly proposes a parity check matrix capable of encoding and decoding a space-time LDPC code having a full diversity gain, thereby maximizing error correction capability and entire system performance. In addition, because the LDPC scheme is used as a coding scheme of a space-time code, it is possible to encode and decode the space-time code to improve performance with a relatively simple hardware structure.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A method for generating a parity check matrix of a space-time low density parity check (LDPC) code in a mobile communication system including a transmitter using a plurality of transmission antennas and a receiver using a plurality of reception antennas, the method comprising the steps of:
   determining a size of a parity check matrix such that the size of the parity check matrix corresponds to a coding rate used when information data is encoded into a space-time LDPC code and a length of a codeword of the space-time LDPC code;
   dividing the parity check matrix having the determine size into a first partial matrix corresponding to the information data and a second partial matrix corresponding to a parity;
   generating a third partial matrix comprised of even-numbered columns of the first partial matrix, a fourth partial matrix comprised of odd-numbered columns of the second partial matrix, a fifth partial matrix obtained by combining the third partial matrix with the fourth partial matrix, a sixth partial matrix comprised of odd-numbered columns of the first partial matrix, a seventh partial matrix comprised of even-numbered columns of the second partial matrix, an eighth partial matrix obtained by combining the sixth partial matrix with the seventh partial matrix, and a ninth partial matrix obtained by exclusive-ORing the first partial matrix and the second partial matrix; and
   generating the parity check matrix such that the fifth partial matrix and the eighth partial matrix have a predetermined rank in the ninth partial matrix and a binary field.

2. The method of claim 1, wherein the predetermined rank is a full rank.

3. The method of claim 1, wherein the number of the transmission antennas is 2, and the space-time LDPC code is signal-mapped using a Binary Phase Shift Keying (BPSK) scheme.

4. A method for generating a parity check matrix of a space-time low density parity check (LDPC) code in a mobile communication system including a transmitter using a method comprising the steps of:
   determining a size of a parity check matrix such that the size of the parity check matrix corresponds to a coding rate used when information data is encoded into a space-time LDPC code and a length of a codeword of the space-time LDPC code;
   dividing the space-time LDPC code into a real-part space-time LDPC code and an imaginary-part space-time LDPC code, dividing the real-part space-time LDPC code into a first codeword transmitted via a first transmission antenna and a second codeword transmitted via a second transmission antenna, and dividing the imaginary-part space-time LDPC code into a third codeword transmitted via the first transmission antenna and a fourth codeword transmitted via the second transmission antenna;
   dividing the parity check matrix into a first partial matrix corresponding to the first codeword and the third codeword and a second partial matrix corresponding to the second codeword and the fourth codeword; and
   generating the parity check matrix such that the first partial matrix, the second partial matrix, and a third partial matrix obtained by exclusive-ORing the first partial matrix and the second partial matrix have a predetermined rank in a binary field.

5. The method of claim 4, wherein the parity check matrix is generated such that the real-part space-time LDPC code and the imaginary-part space-time LDPC code have a predetermined rank in a binary field.

6. The method of claim 5, wherein the predetermined rank is a full rank.

7. The method of claim 6, wherein the real-part space-time LDPC code is a codeword corresponding to real-part information data of the information data, and the imaginary-part space-time LDPC code is a codeword corresponding to imaginary-part information data of the information data.

8. The method of claim 7, wherein the number of the transmission antennas is 2, and the space-time LDPC code is signal-mapped using any one of a Quadrature Phase Shift Keying (QPSK) scheme and a 4-ary Quadrature Amplitude Modulation (4QAM) scheme.

9. A method for encoding a space-time low density parity check (LDPC) code in a mobile communication system including a transmitter using a plurality of transmission antennas and a receiver using a plurality of reception antennas, the method comprising the steps of:
receiving information data;
generating an LDPC code by encoding the information data such that a fifth partial matrix obtained by combining a second partial matrix comprised of even-numbered columns of a first partial matrix corresponding to the information data with a fourth partial matrix comprised of odd-numbered columns of a third partial matrix corresponding to a parity, and an eighth partial matrix obtained by combining a sixth partial matrix comprised of odd-numbered columns of the first partial matrix with a seventh partial matrix comprised of even-numbered columns of the third partial matrix correspond to a ninth partial matrix obtained by exclusive-ORing the first partial matrix and the third partial matrix and a parity check matrix having a predetermined rank in a binary field; and
generating a space-time LDPC code by spatial-mapping the LDC code according to a predetermined spatial mapping scheme.

10. The method of claim 9, wherein the predetermined rank is a full rank.

11. The method of claim 10, wherein the number of the transmission antennas is 2, and the space-time LDPC code is signal-mapped using a Binary Phase Shift Keying (BPSK) scheme.

12. The method of claim 11, wherein the step of generating the information data into the space-time LDPC code comprises the steps of:
parallel-converting the information data into first information data and second information data;
generating a first codeword being a first parity of the information data by encoding the first information data according to the parity check matrix;
generating a second codeword being a second parity of the information data by encoding the second information data according to the parity check matrix; and
generating the space-time LDPC code by performing spatial mapping such that even-numbered bits constituting the first information data, even-numbered bits constituting the second information data, odd-numbered bits constituting the first codeword, and odd-numbered bits constituting the second codeword are transmitted via any one of the 2 transmission antennas, and even-numbered bits constituting the second codeword, even-numbered bits constituting the first codeword, odd-numbered bits constituting the second information data, and odd-numbered bits constituting the first information data are transmitted via the other transmission antenna.

13. A method for encoding a space-time low density parity check (LDPC) code in a mobile communication system including a transmitter using a plurality of transmission antennas and a receiver using a plurality of reception antennas, the method comprising the steps of:
receiving information data;
generating an LDPC code by encoding the information data such that a first partial matrix corresponding to a first codeword and a third codeword, a second partial matrix corresponding to a second codeword and a fourth codeword, and a third partial matrix obtained by exclusive-ORing the first partial matrix and the second partial matrix correspond to a parity check matrix having a predetermined rank in a binary field; and
generating a space-time LDPC code by spatial-mapping the LDPC code according to a predetermined spatial mapping scheme;
wherein the space-time LDPC code is divided into a real-part space-time LDPC code and an imaginary-part space-time LDPC code, the real-part space-time LDPC code is divided into a first codeword transmitted via a first transmission antenna among the transmission antennas and a second codeword transmitted via a second transmission antenna among the transmission antennas, and the imaginary-part space-time LDPC code is divided into a third codeword transmitted via the first transmission antenna and a fourth codeword transmitted via the second transmission antenna.

14. The method of claim 13, wherein the space-time LDPC code is signal-mapped using any one of a Quadrature Phase Shift Keying (QPSK) scheme and a 4-ary Quadrature Amplitude Modulation (4QAM) scheme.

15. The method of claim 14, wherein the step of generating the information data into the space-time LDPC code comprises the steps of:
parallel-converting the information data into real-part information data and imaginary-part information data;
generating a first codeword by encoding the real-part information data according to the parity check matrix;
generating a second codeword by encoding the imaginary-part information data according to the parity check matrix; and
generating the space-time LDPC code by performing spatial mapping such that predetermined bits among bits constituting the first codeword and predetermined bits among bits constituting the second codeword are transmitted via the first transmission antenna and the remaining bits except the predetermined bits among the bits constituting the first codeword and the remaining bits except the predetermined bits among the bits constituting the second codeword are transmitted via the second transmission antenna.

16. The method of claim 15, wherein the parity check matrix is generated such that the real-pan space-time LDPC code and the imaginary-pan space-time LDPC code have a predetermined rank in a binary field.

17. The method of claim 16, wherein the predetermined rank is a fill rank.

18. An apparatus for encoding a space-time low density parity check (LDPC) code in a mobile communication system including a transmitter using a plurality of transmission antennas and a receiver using a plurality of reception antennas, the apparatus comprising:

an LDPC encoding pan for, upon receiving information data, encoding the information data into an LDPC code according to a control signal;

a spatial mapper for generating a space-time LDPC code by spatial-mapping the LDPC code according to a predetermined spatial mapping scheme; and a controller for generating the LDPC code by encoding the information data such that a fifth partial matrix obtained by combining a second partial matrix comprised of even-numbered columns of a first partial matrix corresponding to the information data with a fourth partial matrix comprised of odd-numbered columns of a third partial matrix corresponding to a parity, and an eighth partial matrix obtained by combining a sixth partial matrix comprised of odd-numbered columns of the first partial matrix with a seventh partial matrix comprised of even-numbered columns of the third partial matrix correspond to a ninth partial matrix obtained by exclusive-ORing the first partial matrix and the third partial matrix and a parity check matrix having a predetermined rank in a binary field.

19. The apparatus of claim 18, wherein the predetermined rank is a full rank.

20. The apparatus of claim 19, wherein the number of the transmission antennas is 2, and the space-time LDPC code is signal-mapped using a Binary Phase Shift Keying (BPSK) scheme.

21. The apparatus of claim 20, further comprising a serial-to-parallel converter for parallel-converting the information data into first information data and second information data.

22. The apparatus of claim 21, wherein the LDPC encoder comprises:

a first LDPC encoder for generating a first codeword being a first parity of the information data by encoding the first information data according to the parity check matrix; and a second LDPC encoder for generating a second codeword being a second parity of the information data by encoding the second information data according to the parity check matrix.

23. The apparatus of claim 22, wherein the spatial mapper performs spatial mapping such that even-numbered bits constituting the first information data, even-numbered bits constituting the second information data, odd-numbered bits constituting the first codeword, and odd-numbered bits constituting the second codeword are transmitted via any one of the 2 transmission antennas, and even-numbered bits constituting the second codeword, even-numbered bits constituting the first codeword, odd-numbered bits constituting the second information data, and odd-numbered bits constituting the first information data are transmitted via the other transmission antenna.

24. An apparatus for encoding a space-time low density parity cheek (LDPC) code in a mobile communication system including a transmitter using a plurality of transmission antennas and a receiver using a plurality of reception antennas, the apparatus comprising:

a space-time LDPC encoder for, upon receiving information data, encoding the information data into an LDPC code according to a control signal, and generating a space-time LDPC code by spatial-mapping the LDPC code according to a predetermined spatial mapping scheme; and a controller for generating an LDPC code by encoding the information data such that a first partial matrix corresponding to a first codeword and a third codeword, a second partial matrix corresponding to a second codeword and a fourth codeword, and a third partial matrix obtained by exclusive-ORing the first partial matrix and the second partial matrix correspond to a parity check matrix having a predetermined rank in a binary field;

wherein the space-time LDPC code is divided into a real-part space-time LDPC code and an imaginary-part space-time LDPC code, the real-part space-time LDPC code is divided into a first codeword transmitted via a first transmission antenna among the transmission antennas and a second codeword transmitted via a second transmission antenna among the transmission antennas, and the imaginary-part space-time LDPC code is divided into a third codeword transmitted via the first transmission antenna and a fourth codeword transmitted via the second transmission antenna.

25. The apparatus of claim 24, further comprising a signal mapper for signal-mapping the space-time LDPC code using any one of a Quadrature Phase Shift Keying (QPSK) scheme and a 4-ary Quadrature Amplitude Modulation (4QAM) scheme.

26. The apparatus of claim 25, further comprising a serial-to-parallel converter for parallel-converting the information data into real-part information data and imaginary-part information data.

27. The apparatus of claim 26, wherein the space-time LDPC encoder comprises:

a real-part space-time LDPC encoder for generating a first codeword by encoding the real-part information data according to the parity check matrix; and an imaginary-part space-time LDPC encoder for generating a second codeword by encoding the imaginary-part information data according to the parity check matrix;

wherein the real-part space-time LDPC encoder and the imaginary-part space-time LDPC encoder generate the space-time LDPC code by performing spatial mapping such that predetermined bits among bits constituting the first codeword and predetermined bits among bits constituting the second codeword are transmitted via the first transmission antenna and the remaining bits except the predetermined bits among the bits constituting the first codeword and the remaining bits except the predetermined bits among the bits constituting the second codeword are transmitted via the second transmission antenna.

28. The apparatus of claim 27, wherein the parity check matrix is generated such that the real-part space-time LDPC code and the imaginary-part space-time LDPC code have a predetermined rank in a binary field.

29. The apparatus of claim 28, wherein the predetermined rank is a full rank.

30. A method for decoding a space-time low density parity check (LDPC) code in a mobile communication system including a transmitter using a plurality of transmission antennas and a receiver using a plurality of reception antennas, the method comprising the steps of:

(a) detecting a reception signal from signals received via their associated reception antennas;

(b) performing spatial mapping node decoding based on a detected value of the received signals;

(c) decoding the spatial-mapped-node-decoded signal according to a predetermined parity check matrix; and (d) if probability values of the signals decoded according to the parity check matrix satisfy a predetermined iterative decoding stop condition, hard-deciding the probability values and outputs the hard-decided probability values as information data, and if the probability values do not satisfy the iterative decoding stop condition, repeatedly performing the steps (b) and (c) until the probability values satisfies the iterative decoding stop condition, wherein the parity check matrix is formed such that a fifth partial matrix obtained by combining a second partial matrix comprised of even-numbered columns of a first partial matrix corresponding to the information data with a fourth partial matrix comprised of odd-numbered columns of a third partial matrix corresponding to a parity, and an eighth partial matrix obtained by combining a sixth partial matrix comprised of odd-numbered columns of the first partial matrix with a seventh partial matrix comprised of even-numbered columns of the third partial matrix correspond to a ninth partial matrix obtained by exclusive-ORing the first partial matrix and the third partial matrix and a parity check matrix having a predetermined rank in a binary field.

31. The method of claim 30, wherein the predetermined rank is a full rank.

32. The method of claim 31, wherein the number of the transmission antennas is 2, and the space-time LDPC code is signal-mapped using a Binary Phase Shift Keying (BPSK) scheme.

33. The method of claim 30, wherein a parity check matrix is formed such that a first partial matrix corresponding to a first codeword and a third codeword, a second partial matrix corresponding to a second codeword and a fourth codeword, and a third partial matrix obtained by exclusive-ORing the first partial matrix and the second partial matrix have a predetermined rank in a binary field;

wherein the space-time LDPC code is divided into a real-part space-time LDPC code and an imaginary-part space-time LDPC code, the real-part space-time LDPC code is divided into a first codeword transmitted via a first transmission antenna among the transmission antennas and a second codeword transmitted via a second transmission antenna among the transmission antennas, and the imaginary-part space-time LDPC code is divided into a third codeword transmitted via the first transmission antenna and a fourth codeword transmitted via the second transmission antenna.

34. The method of claim 33, wherein the predetermined rank is a full rank.

35. The method of claim 34, wherein the space-time LDPC code is signal-mapped using any one of a Quadrature Phase Shift Keying (QPSK) scheme and a 4-ary Quadrature Amplitude Modulation (4QAM) scheme.

36. An apparatus for decoding a space-time low density parity check (LDPC) code in a mobile communication system including a transmitter using a plurality of transmission antennas and a receiver using a plurality of reception antennas, the apparatus comprising:

a detector for detecting a reception signal from signals received via their associated reception antennas;

a spatial mapping node decoder for performing spatial mapping node decoding based on a detected value of the received signals;

an LDPC decoding part for decoding the spatial-mapped-node-decoded signal according to a predetermined parity check matrix; and a controller for performing a control operation such that if probability values of the signals decoded according to the parity check matrix satisfy a predetermined iterative decoding stop condition, the probability values are hard-decided and output as information data, and if the probability values do not satisfy the iterative decoding stop condition, the spatial mapping node decoding process and the decoding process are repeatedly performed until the probability values satisfies the iterative decoding stop condition, wherein the parity check matrix is formed such that a fifth partial matrix obtained by combining a second partial matrix comprised of even-numbered columns of a first partial matrix corresponding to the information data with a fourth partial matrix comprised of odd-numbered columns of a third partial matrix corresponding to a parity, and an eighth partial matrix obtained by combining a sixth partial matrix comprised of odd-numbered columns of the first partial matrix with a seventh partial matrix comprised of even-numbered columns of the third partial matrix correspond to a ninth partial matrix obtained by exclusive-ORing the first partial matrix and the third partial matrix and a parity check matrix having a predetermined rank in a binary field.

37. The apparatus of claim 36, wherein the predetermined rank is a full rank.

38. The apparatus of claim 37, wherein the number of the transmission antennas is 2, and the space-time LDPC code is signal-mapped using a Binary Phase Shift Keying (BPSK) scheme.

39. The apparatus of claim 36, wherein a parity check matrix is formed such that a first partial matrix corresponding to a first codeword and a third codeword, a second partial matrix corresponding to a second codeword and a fourth codeword, and a third partial matrix obtained by exclusive-ORing the first partial matrix and the second partial matrix have a predetermined rank in a binary field;

wherein the space-time LDPC code is divided into a real-part space-time LDPC code and an imaginary-part space-time LDPC code, the real-part space-time LDPC code is divided into a first codeword transmitted via a first transmission antenna among the transmission antennas and a second codeword transmitted via a second transmission antenna among the transmission antennas, and the imaginary-part space-time LDPC code is divided into a third codeword transmitted via the first transmission antenna and a fourth codeword transmitted via the second transmission antenna.

40. The apparatus of claim 39, wherein the predetermined rank is a full rank.

41. The apparatus of claim 40, wherein the space-time LDPC code is signal-mapped using any one of a Quadrature Phase Shift Keying (QPSK) scheme and a 4-ary Quadrature Amplitude Modulation (4QAM) scheme.

* * * * *